United States Patent
Lewis

(10) Patent No.: US 8,806,259 B2
(45) Date of Patent: Aug. 12, 2014

(54) TIME DIVISION MULTIPLEXED MULTIPORT MEMORY IMPLEMENTED USING SINGLE-PORT MEMORY ELEMENTS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 341 days.

(21) Appl. No.: 13/284,721

(22) Filed: Oct. 28, 2011

(65) Prior Publication Data

US 2013/0111253 A1    May 2, 2013

(51) Int. Cl.
*G06F 13/42* (2006.01)
*G06F 1/12* (2006.01)

(52) U.S. Cl.
CPC ..................................... *G06F 1/12* (2013.01)
USPC ........................................................ 713/400

(58) Field of Classification Search
CPC ..................................................... G06F 1/12
USPC ........... 713/400; 711/109, 139, 149–151, 169
See application file for complete search history.

(56) References Cited

U.S. PATENT DOCUMENTS

| | | | |
|---|---|---|---|
| 4,796,232 A | 1/1989 | House | |
| 4,937,781 A | 6/1990 | Lee et al. | |
| 5,047,921 A | 9/1991 | Kinter et al. | |
| 5,708,850 A * | 1/1998 | Staros | 710/48 |
| 5,768,211 A | 6/1998 | Jones et al. | |
| 5,973,985 A | 10/1999 | Ferrant | |
| 6,118,689 A | 9/2000 | Kuo et al. | |
| 6,388,939 B1 | 5/2002 | Manapat et al. | |
| 6,606,275 B2 | 8/2003 | Shau | |
| 6,751,151 B2 | 6/2004 | Hsu et al. | |
| 6,816,955 B1 | 11/2004 | Raza et al. | |
| 7,116,605 B2 | 10/2006 | Hong | |
| 7,421,559 B1 * | 9/2008 | Yadav | 711/169 |
| 7,447,059 B2 | 11/2008 | Uematsu | |
| 8,555,011 B1 * | 10/2013 | Yadav | 711/162 |
| 2006/0203597 A1 | 9/2006 | Izumino | |
| 2007/0174513 A1 * | 7/2007 | Wrigley et al. | 710/52 |
| 2008/0037357 A1 | 2/2008 | Pelley, III | |
| 2008/0077747 A1 * | 3/2008 | Hur et al. | 711/149 |

OTHER PUBLICATIONS

Hu et al., U.S. Appl. No. 13/234,925, filed Sep. 16, 2011.

* cited by examiner

*Primary Examiner* — Raymond Phan
(74) *Attorney, Agent, or Firm* — Treyz Law Group; Jason Tsai

(57) ABSTRACT

Integrated circuits having single-port memory elements may be provided. The single-port memory elements may be controlled using a control circuit to emulate multiport functionality. In one suitable embodiment, the control circuit may be an arbitration circuit configured to execute a memory request as soon as it is received by the arbitration circuit. Requests received while a current memory access is being performed may be put on hold until the current memory access has been completed. In another suitable embodiment, the control circuit may be a sequencing circuit configured to service memory access requests from a synchronous port and an asynchronous port. Memory access requests received at the synchronous port may be serviced immediately, whereas memory access requests received at the asynchronous port may be synchronized to an internal memory clock signal and may be serviced after a preceding memory access request associated with the synchronous port has been serviced.

19 Claims, 7 Drawing Sheets

TIME DIVISION MULTIPLEXED MULTIPORT MEMORY IMPLEMENTED USING SINGLE-PORT MEMORY ELEMENTS

BACKGROUND

Integrated circuits such as programmable integrated circuits often contain volatile memory elements in the form of static random access memory (SRAM) cells. Volatile memory elements such as SRAM cells are typically based on cross-coupled inverters (i.e., latches). The memory elements are arranged in arrays. In a typical array, data lines are used to write data into and read data from the memory elements. Address lines are used to select which of the memory elements are being accessed.

Certain applications require the memory elements to have dual-port capabilities (i.e., memory elements that include two ports each of which is used to perform a read or write operation). To support dual-port operations, memory elements are typically formed in an eight-transistor configuration. For example, a conventional dual-port memory element includes two cross-coupled inverters and first and second pairs of access transistors. The first pair of access transistors is coupled to the cross-coupled inverters to serve as a first read/write port, whereas the second pair of access transistors is coupled to the cross-coupled inverters to serve as a second read/write port. The conventional eight-transistor (8T) dual-port memory cell arranged in this way, however, can occupy more than double the area of a conventional six-transistor (6T) single-port memory cell.

In an effort to reduce area of dual-port memory circuitry, techniques have been developed that permit the use of 6T memory elements in providing synchronous dual-port functionality (i.e., both ports are controlled using a single clock). For example, double-clocking techniques involve accessing the memory element during a high clock phase (to fulfill requests associated with a first port) and during a low clock phase (to fulfill requests associated with a second port). Double-clocking memory access, however, limits memory performance and cannot be used to support asynchronous dual-port operation (i.e., operation that involves using two separate clock signals with different clock frequency and/or phase to control the two ports).

SUMMARY

Integrated circuits with memory element circuitry are provided. The memory elements may include single-port memory elements arranged in an array. The memory elements may be configured to interface with peripheral memory control circuitry that provides multiport memory functionality.

The memory circuitry may include a control circuit (sometimes referred to as a sequencing circuit) configured to receive memory access request from a synchronous port and an asynchronous port. Requests associated with the synchronous port may be controlled using a synchronous port clock, whereas requests associated with the asynchronous port may be controlled using an asynchronous port clock. The first and second clock signals may exhibit different clock frequencies/phases. Memory access requests arriving at the synchronous port may be fulfilled as soon as they are received, whereas memory access requests arriving at the asynchronous port may be buffered using a first-in-first-out (FIFO) circuit and synchronized to an internal memory clock using a metastability synchronizer.

For example, in response to detecting a rising edge in the synchronous port clock, the control circuit may sample an existing pending asynchronous port request from the FIFO if the FIFO is not empty (e.g., the synchronizer may be used to latch the pending asynchronous port request). If a synchronous access needs to be serviced at this time, the control circuit will direct the memory circuitry to immediately fulfill that request.

Upon completion of the synchronous access, the sampled asynchronous port request may be deleted from the FIFO since it has been latched using the synchronizer. The control circuit may then proceed to process the sampled asynchronous port request currently latched by the synchronizer and fulfill any additional pending or subsequently arriving asynchronous port requests in the remainder of the current synchronous clock cycle. If the FIFO is empty when an asynchronous request is complete, the control circuit may defer any subsequently arriving asynchronous requests until the next clock cycle of the synchronous port clock.

In addition to the semi-synchronous sequencing circuit described above, the memory circuitry may include an arbitration circuit configured to receive memory access requests from the synchronous and asynchronous ports and to handle the order in which the memory access requests associated with the synchronous and asynchronous ports are executed. For example, the arbitration circuit may be operable in an asynchronous mode (i.e., a mode in which requests from the synchronous and asynchronous ports are controlled using first and second clock signals having different frequencies and/or phases). In the asynchronous mode, the arbitration circuit will execute a memory access request as soon as it is received. For example, if the arbitration circuit detects a given memory request at the synchronous port, the arbitration circuit will direct the control circuit to execute the given memory request. If a second memory request is received at the asynchronous port before the given memory has been fulfilled, the second memory request will be put on hold until the given memory request has been completed. The arbitration circuit will direct the control circuit to execute the second memory request when it detects that the given memory request has been fulfilled.

Further features of the present invention, its nature and various advantages will be more apparent from the accompanying drawings and the following detailed description.

DETAILED DESCRIPTION

Embodiments of the present invention relate to static random-access memory circuitry. The memory circuitry of the present invention may be used in any suitable integrated circuit. For example, the memory circuitry may be used in an integrated circuit memory device such as an application specific integrated circuit (ASIC), a programmable integrated circuit, or other types of integrated circuits.

Figure 1:
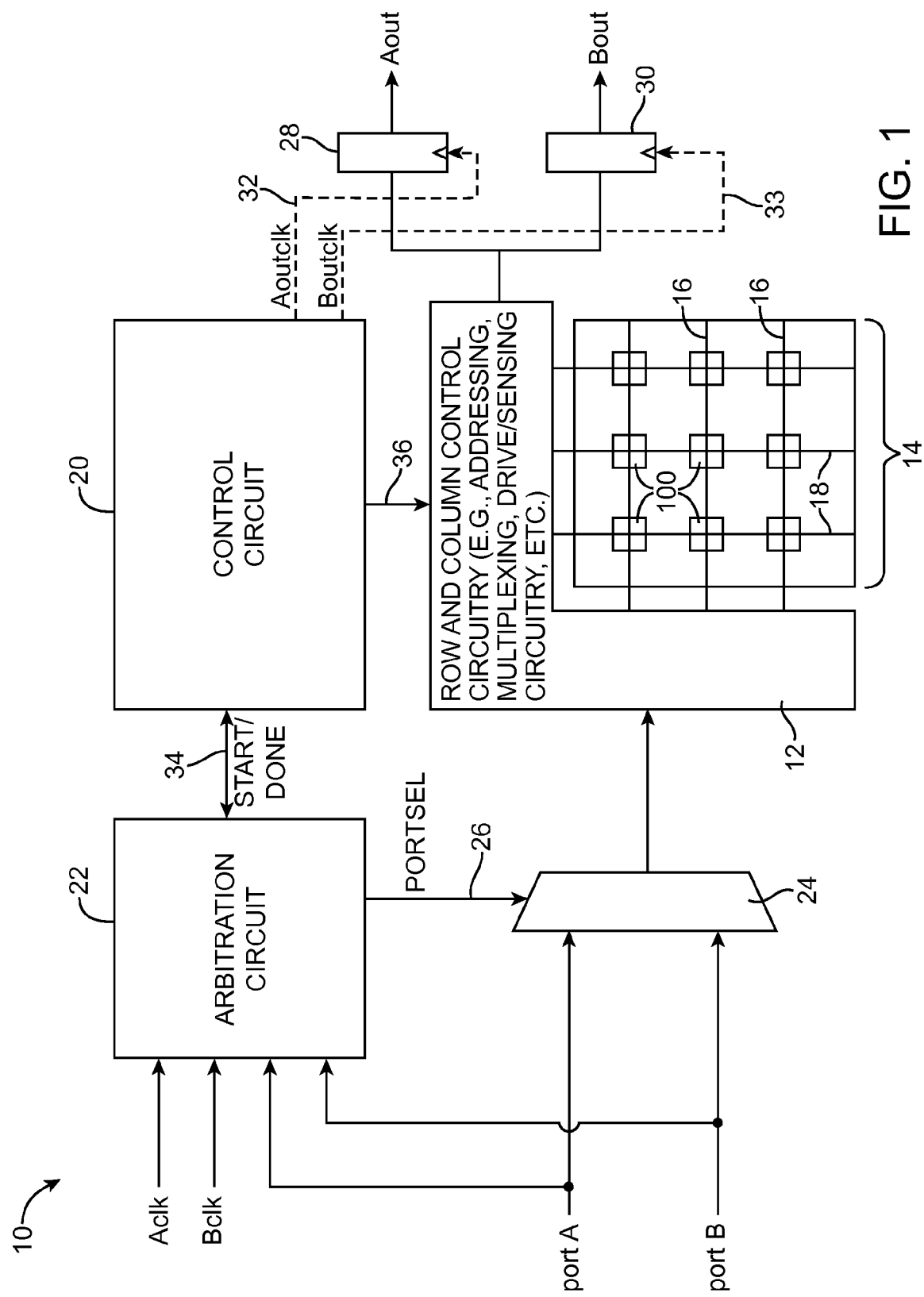
FIG. 1 is a diagram of illustrative multiport memory circuitry with an arbitration circuit.

FIG. 1 is a diagram of an integrated circuit 10 that includes memory circuitry having an arbitration circuit configured to provide synchronous and asynchronous multiport memory operation using only single-port memory elements. Device 10 may contain at least one memory array 14. As shown in FIG. 1, memory array 14 may include memory elements (sometimes referred to as memory cells) 100 arranged in rows and columns. Memory cells 100 may be single-port memory cells. As an example, memory cell 100 may be a single-port differential memory cell having six transistors (e.g., a memory cell having a pair of access transistors that serve as a single port for the memory cell). Using single-port memory cells to provide dual-port memory functionality may help increase die yield, provide reduced minimum required power supply voltage (i.e., reduced power consumption), and conserve integrated circuit real estate.

Memory array 14 may be coupled to row and column control circuitry such as row and column control circuitry 12. Control circuitry 12 may include row addressing circuitry, column multiplexing circuitry, write driver circuitry, read sensing circuitry, data register circuitry, etc. Control circuitry 12 may be used to produce desired time-varying and/or fixed signals to memory cells 100 in array 14 via paths such as paths 16 and 18. The signals that are supplied to memory elements 100 may sometimes be collectively referred to as control signals. In particular contexts, some of these signals may be referred to as power signals, clear signals, data signals, address signals, etc.

A power supply signal may be distributed to all of the cells in array 14 simultaneously over a global memory power line. The memory power line may be oriented vertically so that there is one branch of the memory power line in each path 18 or may be oriented horizontally so that there is one branch of the memory power line in each path 16. As an example, a positive power supply voltage Vcc may be supplied in parallel to each cell 100 using a pattern of shared horizontal or vertical conductors. A ground voltage Vss may likewise be supplied in parallel to cells 100 using a pattern of shared horizontal or vertical lines. Control lines such as address lines and data lines are typically orthogonal to each other (e.g., address lines are horizontal while data lines are vertical or vice versa).

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, less than 0.9 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc−Vss) may also be used.

There may, in general, be any suitable number of conductive lines associated with paths 16 and 18. For example, each row of array 14 may include an associated address line in a respective one of paths 16, whereas each column of array 14 may include associated data lines (e.g., true and complement data lines) in a respective one of paths 18. The terms "rows" and "columns" merely represent one way of referring to particular groups of cells 100 in memory array 14 and may sometimes be used interchangeably. If desired, other patterns of lines may be used in paths 16 and 18. For example, different numbers of power supply signals, address signals, and data signals may be used.

One of the address lines 16 may supply an asserted address signal to select a row of memory cells 100 to be accessed. The address signals on address lines 16 other than the selected address line may remain deasserted while the selected row is being accessed. The data lines in each column may be precharged to positive power supply voltage Vcc during read operations, whereas the data lines in each column may be driven to appropriate voltage levels to write desired write data into at least some of selected cells 100 during write operations. During normal operation, all the address signals may remain deasserted while all the data lines may be precharged to Vcc (as an example).

The single-port memory cells 100 in array 14 may provide dual-port functionality through the use of peripheral memory circuitry. Row and column control circuitry 12 may receive control signals from multiplexing circuit (or multiplexer) 24. Multiplexing circuit 24 may have a first input configured to receive memory access requests (e.g., data and addressing signals) associated with a first memory port (port A), a second input configured to receive memory access request signals associated with a second memory port (port B), an output coupled to circuitry 12, and a control input configured to receive a port select signal PORTSEL from arbitration circuit 22 over path 26.

Arbitration circuit 22 may be configured to receive the memory access requests from port A, the memory access requests from port B, a first clock signal Aclk that is associated with port A, and a second clock signal Bclk that is associated with port B. Arbitration circuit 22 may serve to determine the order in which to process the memory access requests received from port A and port B. The memory circuitry appears to function as a dual-port memory from the reference point of Aclk and Bclk, because the memory circuitry is capable of handling read and write request from at least two ports each of which is control using different clock signals Aclk and/or Bclk (e.g., arbitration circuit 22 may be capable of emulating true dual-port operation).

Arbitration circuit 22 may drive PORTSEL low to selectively route data and addressing signals from port A to row and column control circuitry 12 using multiplexer 24 and may drive PORTSEL high to selectively route data and addressing signals from port B to row and column control circuitry 12 using multiplexer 24 (as an example). When arbitration circuit 22 decides to execute a request, arbitration circuit 22 will temporarily assert signal START provided over path 34 to direct control circuit 20 to enable the desired read/write operation. In response to receiving an asserted START from arbitration circuit 22, control circuit 20 may provide asserted write driver enable signals to circuitry 12 during write operations and may provide asserted sense amplifier enable signals during read operations (e.g., by providing read/write enable signals from control circuit 20 to circuitry 12 over path 36).

During read operations, read signals generated using sense amplifier circuits in circuitry 12 may be fed to output latches 28 and 30. Output latch 28 may be controlled using port A output clock signal Aoutclk provided over path 32 from circuit 20, whereas output latch 30 may be controlled using port B output port signal Boutclk provided over path 33 from circuit 20. The latched output data signals associated with the first memory port (e.g., data signal Aout) and the latched output data signals associated with the second memory port (e.g., data signal Bout) may be provided to other digital or logic circuitry on device 10 for further processing.

When a current memory request has been fulfilled (i.e., upon completion of a read/write operation into memory array 14 at the desired memory location), arbitration circuit 22 may receive an asserted signal DONE from control circuit 20. In response to detecting an asserted DONE, arbitration circuit 22 may proceed to process a successive pending memory access request.

Arbitration circuit 22 may be operable in a synchronous mode and an asynchronous mode. In the synchronous mode, the requests from the multiple ports may be controlled using a shared clock source. As a result, memory access requests from the multiple ports may arrive simultaneously at a rising edge of the shared clock signal. In synchronous mode, arbitration circuit 22 may, for example, determine which one of the multiple ports is to be selected.

In the scenario in which there is a pending request at only one of the two ports, the port associated with the pending request may be selected for processing. In the scenario in which one port receives a write request and the other port receives a read request, the port that receives the read request may be selected for processing (i.e., arbitration circuit 22 may be configured to implement read port priority). If desired, arbitration circuit 22 may also be configured to implement write port priority (i.e., the port that receives the write request may be selected for processing). In the scenario in which both ports receive write requests or both ports receive read requests, the second port may be given priority (i.e., the request at port B will be processed before the request at port A). If desired, arbitration circuitry 22 may also be configured to implement port A priority when both ports received the same type of memory requests (i.e., the request at port A will be processed before the request at port B when ports A and B both receive a read request or when ports A and B both receive a write request).

The memory architecture described in connection with FIG. 1 is merely illustrate and is not intended to limit the scope of the present invention. If desired, arbitration circuit 22 may be configured to handle memory requests from any desired number of ports to support tri-port memory mode, quad-port memory mode, etc.

In another suitable arrangement, arbitration circuit 22 may be configured to operate in asynchronous mode (e.g., a mode in which requests from multiple ports are controlled using clocks of different phases and/or frequencies). In asynchronous dual-port operation, requests from different memory ports often arrive at different times. As a result, arbitration circuit 22 may be configured to process a first arriving memory request as soon as it is received by circuit 22 and to process a second (later) arriving memory request when the first arrive memory request has been fulfilled.

Figure 2:
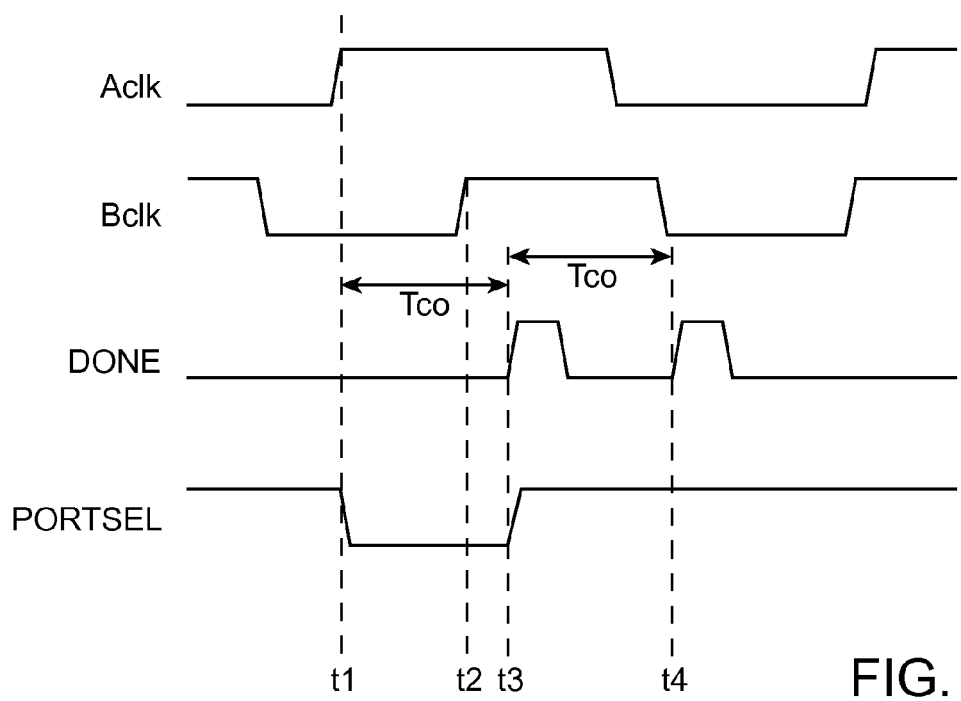
FIGS. 2 and 3 are timing diagrams illustrating the operation of the multiport memory circuitry of FIG. 1.
Figure 3:
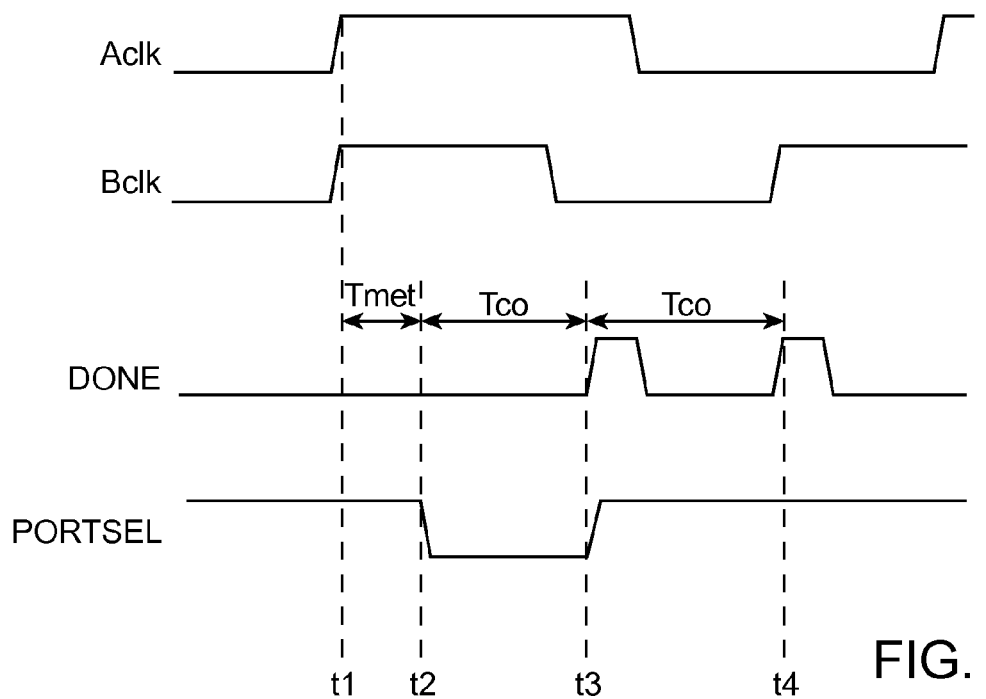

FIGS. 2 and 3 are timing diagrams that illustrate the asynchronous mode operation of the memory circuitry of the type described in connection with FIG. 1. FIG. 2 illustrates a scenario in which a port A memory access request and a port B memory access request are received at different times. At time t1, arbitration circuit 22 may receive a first memory access request from port A (triggered by the rising clock edge of Aclk). In this example, arbitration circuit 22 is not currently handling any memory access request, so arbitration circuit 22 immediately proceeds to fulfill the first memory access request (e.g., signal PORTSEL is driven low to pass the data and addressing signals associated with the first memory access request to row and column control circuitry 12).

At time t2, arbitration circuit 22 may receive a second memory access request from port B (triggered by the rising clock edge of Bclk). Arbitration circuit 22 place the second memory access request on hold until it the first memory access request is fulfilled.

At time t3, signal DONE pulses high to indicate that the first memory access request has been completed. The amount of time it takes to perform a memory access request (e.g., the time period from the rising clock edge of Aclk to the rising edge of DONE) may sometimes be referred to as access time or clock-to-output time Tco. The performance of the memory circuitry may be dependent on the access time Tco for read operations if Tco associated with read operations is greater than Tco associated with write operations. At this time (i.e., time t3), arbitration circuit 22 may proceed to process the second memory access request by raising PORTSEL to pass the data and addressing signals associated with the second memory access request to control circuitry 12 and by directing control circuit 20 enable the desired read/write circuitry in circuitry 12.

At time t4, signal DONE pulses high to indicate that the second memory access request has been completed. The amount of time it takes to perform the second memory access request (e.g., the time period from the previous rising edge of DONE to the current rising edge of DONE) may be equal to access time Tco. The total latency when performing two consecutive memory access requests (assuming that the rising edge of Aclk and Bclk are offset with respect to each other) may therefore be equal to 2*Tco.

FIG. 3 illustrates a scenario in which a first memory access request (e.g., a port A memory access request) and a second memory access request (e.g., a port B memory access request) are received at the same time (Aclk and Bclk clock high simultaneously). At time t1, arbitration circuit 22 may receive a first memory access request from port A and a second memory access request form port B in parallel. When arbitration circuit 22 receives both requests at the same time, arbitration circuit 22 may require time period Tmet to resolve metastability (i.e., to determine which one of the first and second memory access requests is to be processed first).

At time t2 (e.g., time period Tmet after t1), arbitration circuit 22 may decide to fulfill the first memory access request by driving PORTSEL low (as an example). It is also possible that arbitration circuit 22 chooses the second memory access request for processing at time t2. At time t3, signal DONE may be pulsed high to indicate completion of the first memory access request. At this time, the second memory access request may be fulfilled (e.g., PORTSEL may be driven high). At time t4, signal DONE may again be pulsed high to indicate completion of the second memory access request. The total latency for performing two simultaneously arriving memory access requests (when the rising edge of Aclk and Bclk are aligned) may therefore be equal to the sum of Tmet and 2*Tco. The example of FIG. 3 is merely illustrative and does not serve to limit the scope of the present invention.

In one suitable arrangement of the present invention, device 10 may provide multiport functionality using a semi-synchronous approach in which memory accesses are synchronized to a clock signal that is associated with a selected one of the different memory ports (sometimes referred to as the "synchronous" port). This clock signal may therefore be referred to herein as the synchronous port clock or the synchronous clock signal. Row and column control (or memory array control) circuitry 12 may be controlled using an internal memory clock signal that is synchronously related to the synchronous port clock (e.g., the internal memory clock signal may be triggered by the clock signal that is associated with the synchronous port).

Synchronizing memory access to only one of the multiple memory ports effectively eliminates the time required for metastability resolution on the synchronous port. The synchronous port may be given priority so that memory access requests received at this port exhibits a minimal latency of at most one Tco. Memory access requests received at the other port (sometimes referred to as the "asynchronous" port) may be synchronized to the internal memory clock signal. Memory accesses on the asynchronous port may still incur a delay for metastability resolution, but this happens concurrently with access on the synchronous port. Processing memory access requests in this way may be referred to as semi-synchronous time division multiplexed (TDM) multi-port memory control.

Consider a scenario in which a dual-port memory has a dedicated read port and a dedicated write port. If read access is given higher priority, the read port may be configured as the synchronous port while the write port is configured as the asynchronous port. If write access is given higher priority, the write port may be configured as the synchronous port while the read port is configured as the asynchronous port.

Consider another scenario in which a dual-port memory has a first port controlled using a first clock signal and a second port controlled using a second clock signal, where the second clock signal exhibits a frequency that is greater than that of the first clock signal. In this scenario, the port associated with the more critical clock domain may be configured as the synchronous port. For example, the port associated with the faster clock signal may be configured as the synchronous port (e.g., the internal memory clock may be synchronized to the second clock signal). If desired, the port associated with the slower clock domain may instead be configured as the synchronous port (e.g., the internal memory may also be synchronized to the first clock signal).

In general, the internal memory clock signal may be triggered off any one of the different port clocks. When the internal memory clock is triggered, a memory access on the synchronous port may immediately be started. While the memory access of the synchronous port is being fulfilled, memory accesses from the asynchronous port may be resynchronized using the internal memory clock. Because the synchronous port access is started immediately when a memory access request is received at the synchronous port, metastability resolution of the asynchronous port occurs concurrently with access of the synchronous port, thereby reducing Tmet. As a result, synchronous port accesses may experience a latency of Tco, whereas asynchronous port accesses may experience a latency of up to one clock cycle of the synchronous port as well as other queued (or pending) accesses previously and concurrently received by the asynchronous port.

Figure 4:
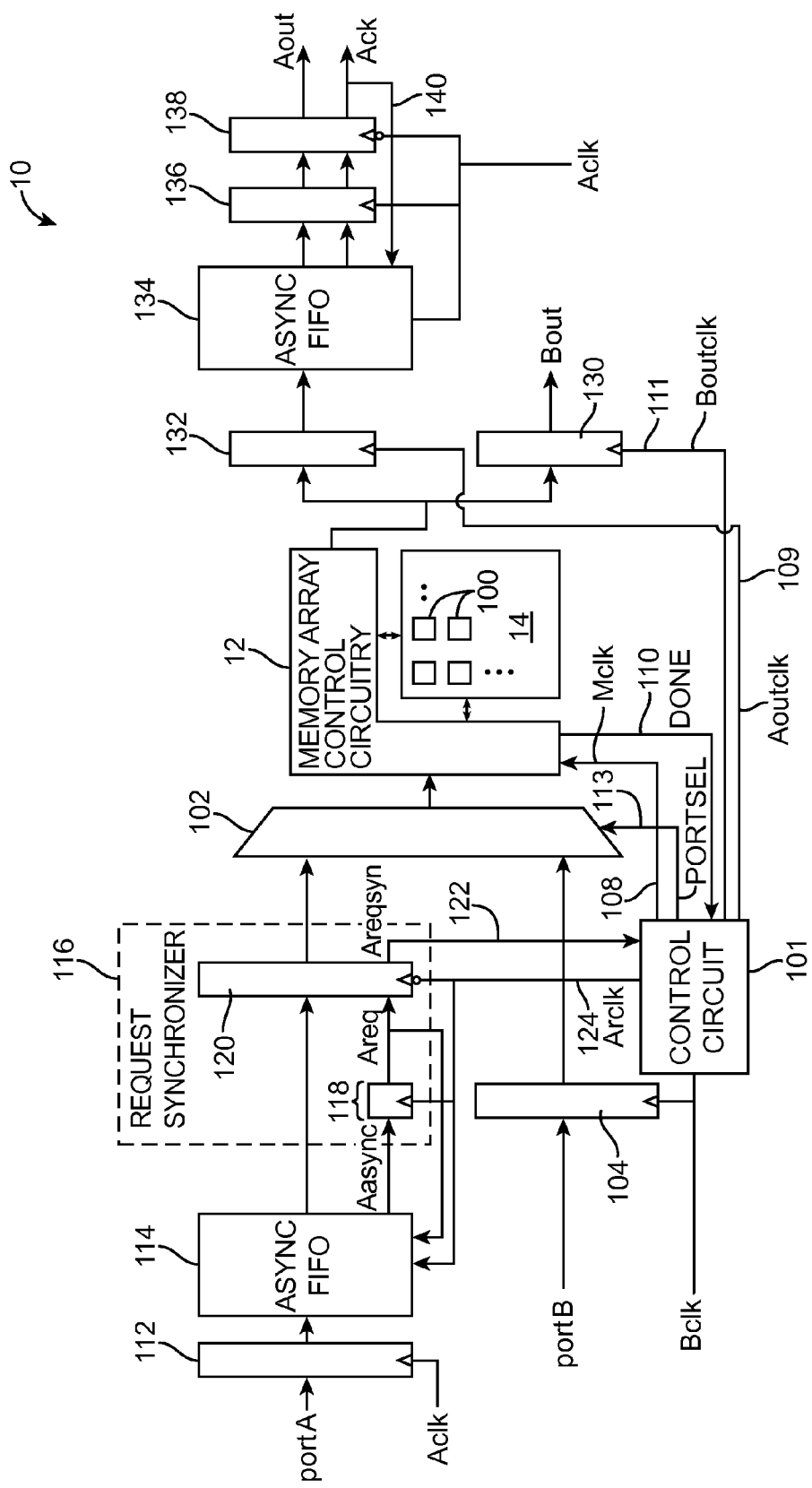
FIG. 4 is a diagram of illustrative semi-synchronous multiport memory circuitry in accordance with an embodiment of the present invention.

FIG. 4 is a diagram of an exemplary implementation of a semi-synchronous dual-port memory. In the example of FIG. 4, port B may be configured as the synchronous port, whereas port A may be configured as the asynchronous port. Data and address signals arriving at port A may be controlled using Aclk (referred to as the asynchronous clock), whereas data and address signals arriving at port B may be controlled using Bclk (referred to as the synchronous clock). Signals Aclk and Bclk may have different clock frequencies/phases.

As shown in FIG. 4, the signals from the synchronous port (i.e., port B) may be received using latch 104. Latch 104 may have a clock control input configured to received Bclk and an output that is coupled to a first input of multiplexing circuit 102. Synchronous clock Bclk may be fed to control circuit 101. Control circuit 101 may be used to generate internal memory clock signals and may serve as a sequencing circuit operable to determine the order in which to fulfill incoming memory access requests. In particular, control circuit may be used to generate internal memory clock Mclk over path 108, port A synchronizing clock Arclk over path 124, port A output clock Aoutclk over path 109, port B output control clock Boutclk over path 111, and multiplexer control signal PORT-SEL over path 113.

The signals from the asynchronous port (i.e., port A) may be received using latch 112. Latch 112 may have a clock control input configured to receive Aclk and an output that is coupled to an asynchronous first-in-first-out (FIFO) circuit 114. FIFO 114 may sometimes be referred to as a buffer circuit. Asynchronous FIFO 114 may be used to buffer incoming requests on port A while requests from port B are being processed. FIFO 114 may have outputs coupled to a metastability synchronizer such as request synchronizer 116. In particular, FIFO 114 may have a first output at which data and address signals associated with a current pending request are provided and a second output at which signal Aasync is provided.

Request synchronizer 116 may include a positive-edge-triggered latch 118 and a negative edge triggered latch 120. Positive-edge-triggered latch 118 may have an input that receives signal Aasync from the second output of FIFO 114, a control input coupled to path 124, and an output at which signal Areq is provided. Negative-edge-triggered latch 120 may have a first input that receives the data and address signals associated with the current pending request from the first output of FIFO 114, a second input that receives signal Areq from the output of latch 118, a control input coupled to path 124, a first output that is coupled to a second input of multiplexer 102, and second output at which signal Areqsyn is provided. Signal Areqsyn may be fed to control circuit 101 over path 122. Multiplexer 102 may be controlled using signal PORTSEL generated from control circuit 101 to selectively route memory access request signals from one of ports A and B to its output.

Memory row and column control circuitry (sometimes referred to as memory array control circuitry) 12 may receive data and addressing signals from the output of multiplexer 102. Circuitry 12 may be controlled using internal memory clock Mclk conveyed over path 108 from control circuit 101. Circuitry 12 may also generate a signal DONE to control circuit 101 over path 110 to indicate completion of a memory access request that has currently been serviced. Signal Arclk generated using control circuit 101 may be fed to the control input of latches 118 and 120 over path 124. FIFO 114 may also be configured to receive signal Areq fed back from the output of latch 118 and signal Arclk.

Data signals read from memory array 14 during read operations may be fed to port B output latch 130 and port A output latch 132. Port A output latch 132 may be controlled using Aoutclk, whereas port B output latch 130 may be controlled using Boutclk. Signals Aoutclk and Boutclk may be generated using control circuit 101. Port B output latch 130 may have an output at which port B output signal Bout is provided. Port A output latch 132 may have an output coupled to output asynchronous FIFO 134. Similar to input FIFO 114, output asynchronous FIFO 134 may serve to buffer the port A output data signals. The port A output data signals may then be passed through positive-edge-triggered latch 136 and negative-edge-triggered latch 138. FIFO 134 and latches 136 and 138 may be clocked using signal Aclk. Latch 138 may have a first output at which port A output signal Aout is provided and a second output at which port A output acknowledge signal Ack is provided. Signal Ack may be fed back to asynchronous FIFO 134 over path 140. An asserted Ack received at FIFO 134 may indicate that a word of data has been successfully latched at the output and may direct FIFO 134 to shift its contents.

Figure 5:
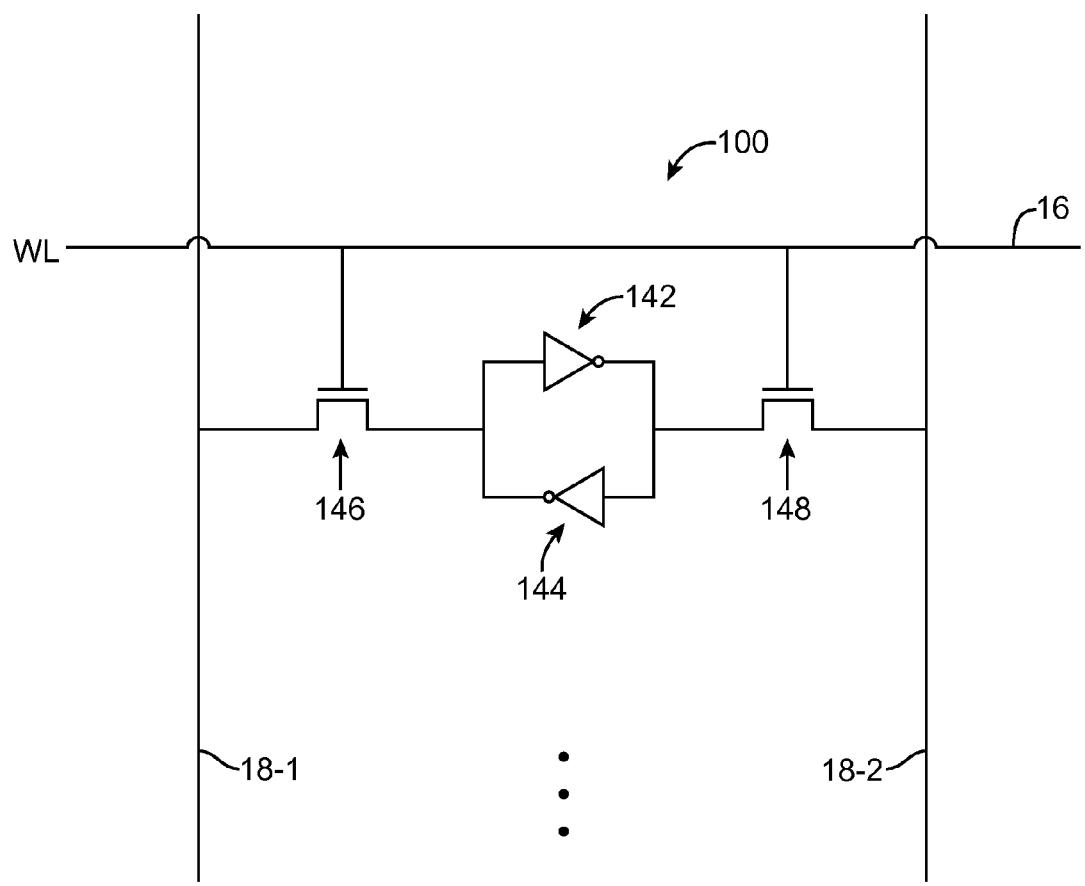
FIG. 5 is a diagram of an illustrative memory element in accordance with an embodiment of the present invention.

FIG. 5 is a circuit diagram of an exemplary single-port memory cell 100 that may be formed in memory array 14. As shown in FIG. 5, cell 100 may include at least one pair of cross-coupled inverters 142 and 144 each having an input and an output. The input of inverter 142 may be coupled to the output of inverter 144, whereas the input of inverter 144 may be coupled to the output of inverter 142. The output of inverter 144 may serve as a first internal data storage node for cell 100, whereas the output of inverter 142 may serve as a second internal data storage node for cell 100. Inverters 142 and 144 cross-coupled in this way may serve to store a single bit of data (e.g., a true version of the data bit may be stored on the first data storage node, whereas an inverted version of the data bit may be stored on the second data storage node) and may sometimes be referred to as a bistable element.

A first access transistor 146 may be coupled between the first data storage node and a first data line 18-1. A second access transistor 148 may be coupled between the second data storage node and a second data line 18-2. Data lines 18-1 and 18-2 may sometimes be referred to as a true and complement bit line pair. Data lines 18-1 and 18-2 may be driven to appropriate values to write data into cell 100 during write operations and may be precharged to a power supply voltage level during read operations.

Access transistors 146 and 148 (sometimes referred to as address transistors) may be controlled by word line signal WL provided over word line 16. Signal WL may be asserted to select a row of memory cells 100 in array 14 to be accessed. Signal WL in the remaining unselected rows may remain deasserted. The single-port memory cell of FIG. 5 is merely illustrative and is not intended to limit the scope of the present invention. If desired, memory cell 100 may include more than two cross-coupled inverting circuits, may include a read buffer circuit, may have a single-ended architecture, etc.

The operation of the TDM memory circuitry described in connection with FIG. 4 may be as follows. A series of memory access requests may be triggered in response to detecting a rising clock edge in the synchronous port clock (i.e., port B). Internal memory clock Mclk may be triggered to assert on a rising edge of synchronous clock Bclk and may be triggered to negate (i.e., deassert) on a rising edge of DONE. If desired, Mclk may be triggered to negate on the falling edge of DONE.

In response to detecting a rising Mclk edge, a port B access is immediately performed so that port B access time is as fast as true dual-port memory (i.e., dual-port memory implemented using dual-port memory cells having eight memory cell transistors). When DONE is asserted, Boutclk may be pulsed high to latch output data signal Bout.

As described previously, port A input asynchronous FIFO 114 may be used to buffer incoming port A memory access requests. Signal Arclk may be used to synchronize port A memory access requests. In addition to triggering Mclk, a rising Bclk edge may trigger signal Arclk to be pulsed high for a predetermined time period. Signal Aasync may generally be asserted if FIFO 114 contains at least one pending port A request. While the port B request is being processed immediately after the rising Bclk edge, Aasync will be sampled during the first half cycle of Arclk to produce Areq using latch 118 (e.g., Aasync will be sampled on a positive clock edge of Arclk), whereas Areq will be sampled during a second half cycle of Arclk to produce Areqsyn using latch 120 (e.g., Areqsyn will be sampled on a negative clock edge of Arclk). Synchronized port A request signal Areqsyn may then be fed to control circuit 101 to indicate that a port A request has yet to be fulfilled during the current Bclk cycle. Sampling and re-sampling a pending port A request in this way may serve to synchronize the port A request to internal memory clock Mclk.

Signal Areq and Arclk may be fed back to asynchronous FIFO 114 as a form of acknowledgement. When FIFO 114 detects a negative edge on Aclk and signal Areq is asserted, Aasync may be negated to indicate that a pending request has been sampled (e.g., to delete that pending request from FIFO 114). Asynchronous FIFO 114 may subsequently shift its contents and if FIFO 114 contains additional pending requests that need to be service, Aasync will be asserted asynchronously.

Figure 6:
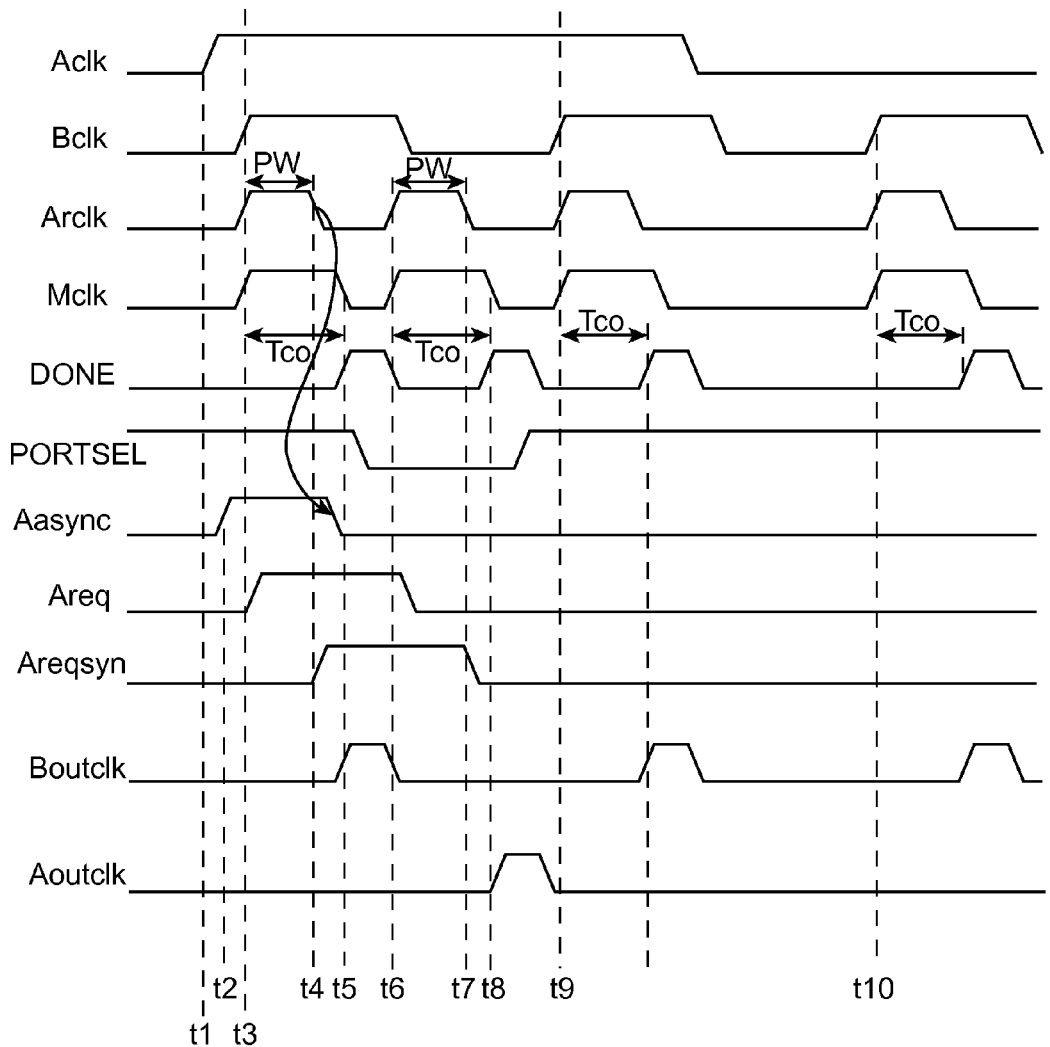
FIGS. 6 and 7 are timing diagrams illustrating the operation of the semi-synchronous multiport memory circuitry of the type shown in FIG. 4 in accordance with an embodiment of the present invention.

FIG. 6 is a timing diagram illustrating the operation of the semi-synchronous TDM memory circuitry when the synchronous port clock is faster than the asynchronous port clock (e.g., when Bclk has a frequency that is greater than the frequency of Aclk). The example of FIG. 6 assumes that asynchronous FIFO 114 contains no pending request prior to time t1. Signal PORTSEL may be high by default to select a port B request for processing. At time t1, signal Aclk may clock high and a port A request may enter FIFO 114. This addition of a new port A request may cause signal Aasync to be asynchronously asserted some time after t1 (e.g., at time t2).

At time t3, signal Bclk may clock high and a B port request may be presented at the output of latch 104 (see, e.g., FIG. 4). This rising edge of Bclk may trigger Mclk to be asserted and may trigger Arclk to be pulsed high for a predetermined pulse width of PW. The rising clock edge of Arclk may cause latch 118 to sample Aasync so that Areq will have the same value as Aasync (e.g., the rising edge of Arclk causes Areq to rise high because Aasync is high at time t3).

At time t4, Arclk may be deasserted. A falling clock edge of Arclk may cause Aasync to be negated (only if Areq is high) and may cause latch 120 to sample Areq so that Areqsyn will have the same value as Areq. At this time, the port A request that arrived at time t1 may be deleted from FIFO 114 since it has already been latched by request synchronizer 116. In this example, the falling edge of Arclk will cause Areqsyn to rise high because Areq is high at time t4. Signal Aasync may remain negated since there are no additional memory access requests from port A.

At time t5, the port B memory access request is fulfilled and signal DONE is pulsed high, thereby causing Mclk to be deasserted and Boutclk to be pulsed high. Signal Boutclk may only be pulsed high in response to completion of a port B memory access. The time from the start of the port B memory access request to corresponding signal DONE being asserted may be equal to access time Tco. Since there is a pending port A memory request (as indicated by an asserted Areqsyn), control circuit 101 may temporarily invert PORTSEL so that the port A memory request may be serviced.

At time t6, DONE may be deasserted. When DONE is low, a subsequent port A memory access may be serviced. Because of the presence of the pending port A memory request, Mclk may be raised high and Arclk may be pulsed high to signify the start of the port A memory access. At time t6, Areq may fall low because there are no newly arriving port A requests (as indicated by a low Aasync).

At time t7, Arclk may be deasserted. A falling clock edge of Arclk may sample Areq, thereby causing Areqsyn to fall low because Areq is low at time t7. A low Areqsyn may indicate that there are no pending port A memory access requests. At time t8, signal DONE is pulsed high and causes Mclk to be deasserted and Aoutclk to be pulsed high. Signal Aoutclk may only be pulsed high in response to completion of a port A memory access. At this time, there are no further memory access requests from port A or port B to be serviced. At time t9, Bclk may clock high, and a second port B memory access request may be serviced. At time t10, Bclk may clock high, and a third port B memory access request may be serviced.

In this scenario in which Bclk is faster than Aclk, the latency of the port A access is increased only by at most one port B cycle, which may be acceptable in true dual-port emulation. When Bclk is much faster than Aclk (e.g., when Bclk is at least three times, at least five times, or at least ten times faster than Aclk), the port A access may be guaranteed to be completed within a small fraction of Aclk.

Figure 7:
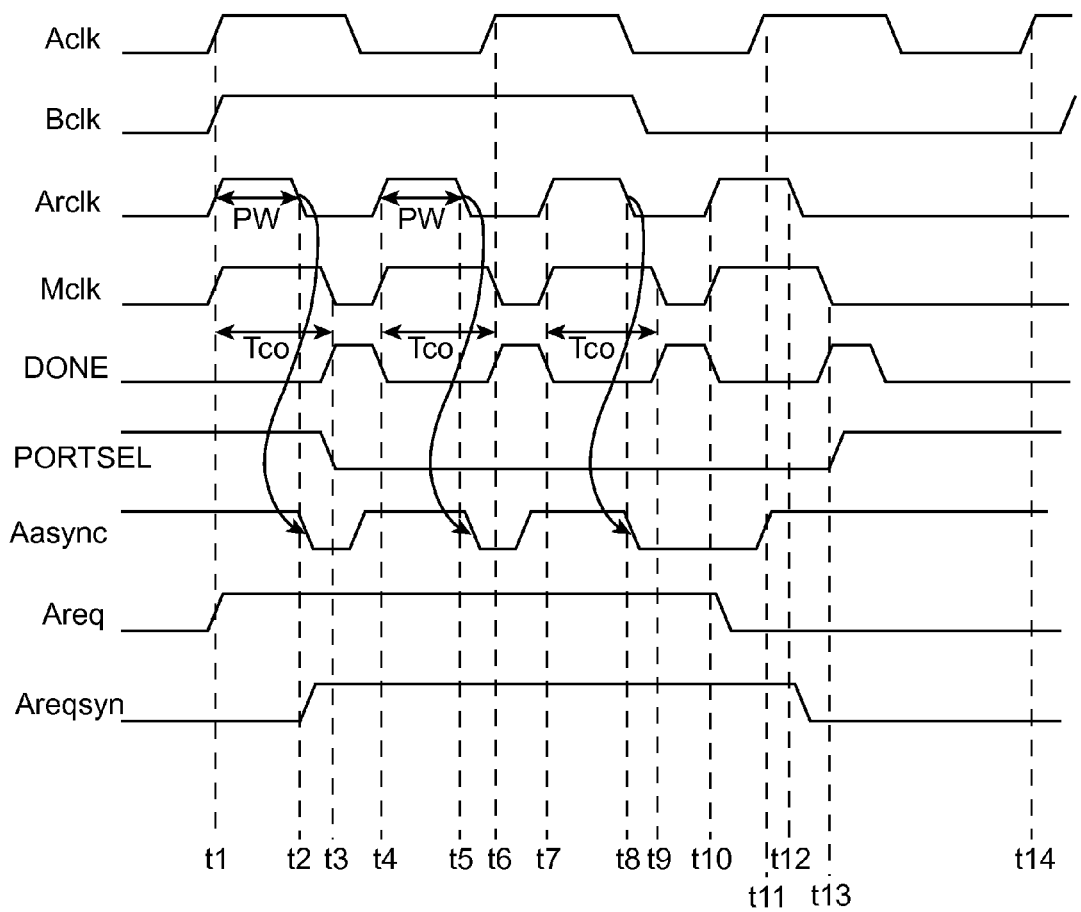

FIG. 7 is a timing diagram illustrating the operation of the semi-synchronous TDM memory circuitry when the asynchronous port clock is faster than the synchronous port clock (e.g., when Bclk has a frequency that is less than the frequency of Aclk). The example of FIG. 7 assumes that asynchronous FIFO 114 contains at least one pending request prior to time t1 (as indicated by asserted Aasync before time t1). Signal PORTSEL may be high by default to select port B request for processing.

At time t1, signals Aclk and Bclk may clock high simultaneously (e.g., a new port A memory access request and a new port B memory access request may arrive in parallel). A rising Bclk will trigger Arclk and Mclk to clock high and Areq to rise (because Aasync is high at time t1). The synchronous port access (i.e., the port B memory access) may immediately be started. At time t2, Arclk may clock low, causing Aasync to negate (e.g., the pending memory access request that was stored in FIFO 114 prior to time t1 may be deleted from FIFO 114 since it has already been latched by request synchronizer 116) and Areqsyn to rise high (because Areq is high at time t2). At time t3, signal DONE may be temporarily asserted to indicate completion of the port B memory access, thereby triggering Mclk to clock low. At this time, PORTSEL may be driven low to select port A for servicing, because there is at least one pending port A request that needs to be serviced (i.e., an unserviced port A request that is currently stored in synchronizer 116), as indicated by a high Areqsyn. Shortly after time t3, signal Aasync may be asserted since there FIFO 114 still contains a queued port B memory access that arrived at time t1.

At time t4, DONE may be deasserted and the pending port B memory access that had been stored in FIFO 114 before time t1 may be serviced. At this time, control circuit 101 may drive Arclk and Mclk high. Signal Aasync may be sampled using latch 118 but Areq will remain high since Aasync is high at time t4. At time t5, Arclk may clock low, causing Aasync to negate (e.g., the pending memory access request that arrived at time t1 may be deleted since it has just been latched by request synchronizer 116). Signal Areq may be sampled using latch 120 but Areqsyn will remain high since Areq is high at time t5. At time t6, signal DONE may be temporarily asserted to indicate completion of the queued port A memory access, thereby triggering Mclk to clock low. Signal PORTSEL may remain low since there is still a port A memory access request that has yet to be serviced. At around time t6, Aclk may clock high and a first additional port A memory access request may enter FIFO 114. Shortly after time t6, signal Aasync may be asserted since FIFO 114 still contains the first additional port A memory access request that arrived at time t6.

At time t7, DONE may be deasserted and the pending port A memory access that arrived at time t1 (and that is currently stored in synchronizer 116) may be serviced. At this time, control circuit 101 may drive Arclk and Mclk high. Signal Aasync may be sampled using latch 118, and Areq will remain high since Aasync is high at time t7. At time t8, Arclk may clock low, causing Aasync to negate (e.g., the first additional port A memory access request that arrived at time t6 may be deleted). Signal Areq may be sampled using latch 220 but Areqsyn will remain high since Areq is high at time t8. At time t9, signal DONE may be temporarily asserted to indicate completion of the current port A memory access, thereby triggering Mclk to clock low. Signal PORTSEL may remain low since there is still the first additional port A memory access request that has yet to be serviced. Signal Aasync may remain negated since there are no additional queued requests in FIFO 114 at this time.

At time t10, DONE may be deasserted and the first additional port A memory access request that arrived at time t6 may be serviced. At this time, control circuit 101 may drive Arclk and Mclk high. Signal Aasync may be sampled using latch 118, causing Areq to fall low since Aasync is low at time t10. At time t11, Aclk may clock high and a second additional port A memory access request may enter FIFO 114, causing Aasync to rise high. At time t12, Arclk may clock low. Because Areq is low, no request needs to be deleted from FIFO 114 (e.g., FIFO 114 may only be configured to delete a request at the falling clock edge of Arclk if and only if Areq is high). Signal Areq may be sampled using latch 120, causing Areqsyn to fall low since Areq is low at time t12. At time t13, signal DONE may be temporarily asserted to indicate completion of the first additional port A memory access, thereby triggering Mclk to clock low. Signal PORTSEL may be driven back high if Areq is low. Signal Aasync will remain high since no additional port A requests will be serviced for the remainder of the current Bclk cycle. At time t14, a new port A memory request may arrive and may be stored in FIFO 114 for at least until the rising edge of Bclk.

In this scenario in which Aclk is faster than Bclk, the depth of FIFO 114 may be configured to be sufficiently deep to accommodate the number of port A requests that can occur in a port B clock cycle. If desired, the asynchronous arbitration multiport emulation approach described in connection with FIG. 1 may be used when Aclk is faster than Bclk.

Figure 8:
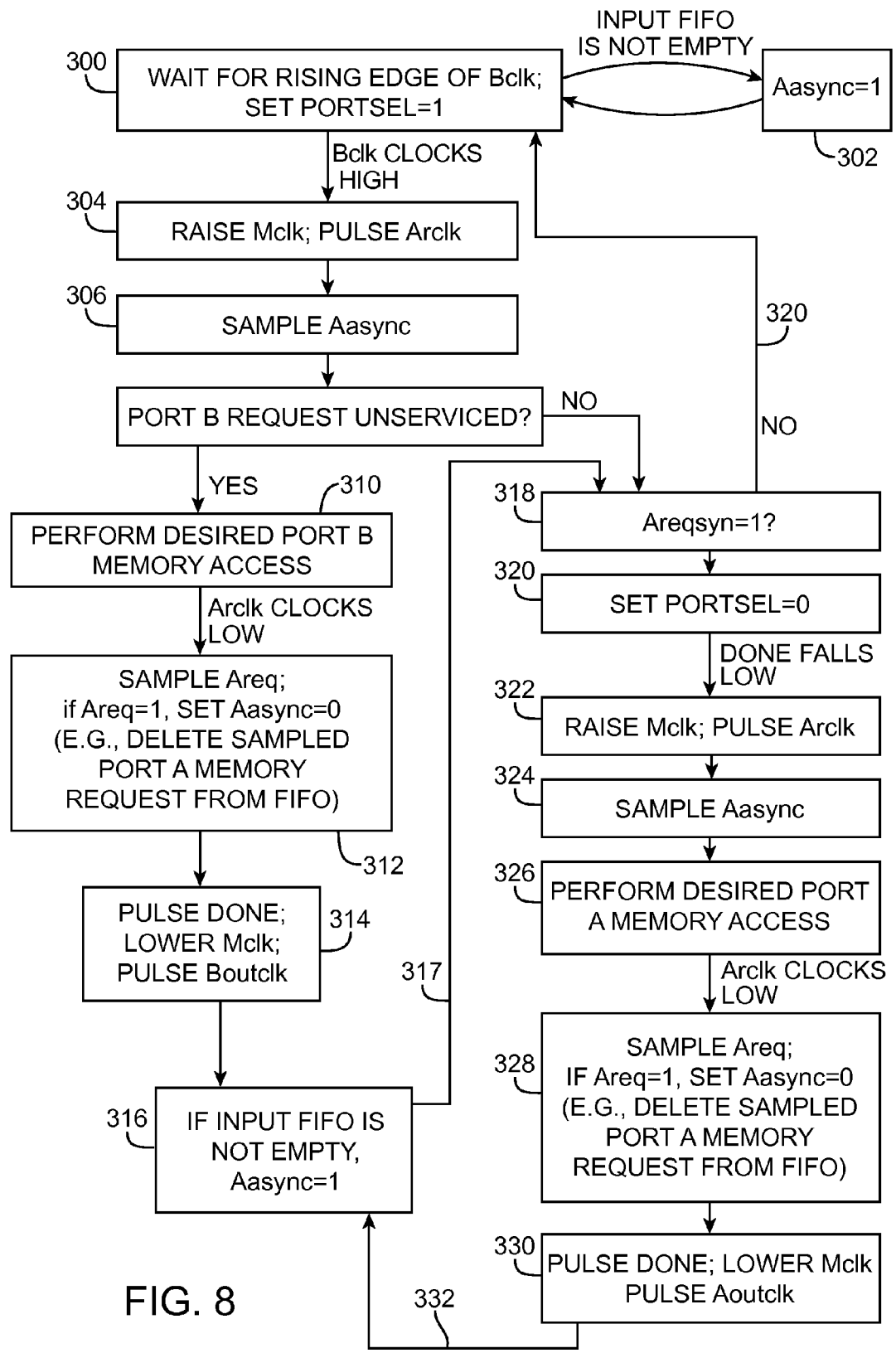
FIG. 8 is a flow chart of illustrative ste involved in fulfilling memory access requests using the multiport memory circuitry of the type shown in FIG. 4 in accordance with an embodiment of the present invention.

FIG. 8 is a flow chart of illustrative ste involved in fulfilling memory access requests using the semi-synchronous TDM multiport memory circuitry of the type shown in FIG. 4. At step 300, control circuit 101 may wait for a Bclk rising edge. Signal PORTSEL may be set to its default value of one (i.e., to selective route a synchronous port B request to memory array control circuitry 12). If input FIFO 114 is not empty, signal Aasync may be asynchronously set to one (step 302).

In response to detecting a rising Bclk edge, control circuit 101 may raise internal memory clock Mclk and pulse Arclk high (step 304). At step 306, Aasync may be sampled using latch 118 (e.g., Areq is set to the sampled value of Aasync). If there is a port B memory access request that has yet to be serviced, processing may proceed to step 310. If no port B request is present, processing may proceed to step 318 after Arclk is negated.

At step 310, the desired port B read/write memory access may be performed. In response to detecting a falling Arclk edge, Areq may be sampled using latch 120 (e.g., Areqsyn is set to the sampled valued of Areq), as shown in step 312. If Areq is high, the output of FIFO 114 is latched, thereby causing Aasync to be negated and the oldest port A memory access request (i.e., a port A memory access request arriving before any other request currently stored in FIFO 114) may be deleted from FIFO 114. At step 314, DONE may be pulsed high, thereby triggering Mclk to clock low and Boutclk to pulse high.

At step 316, Aasync may be asserted if FIFO 114 contains at least one unserviced request. Processing may then proceed to step 318, as indicated by path 317. At step 318, control circuit 101 may check whether Areqsyn is high or low. If Areqsyn is low, processing may loop back to step 300 as indicated by path 320 (e.g., control circuit 101 will defer any port A requests for the remainder of the current Bclk cycle). If Areqsyn is high, processing may proceed to step 320.

At step 320, signal PORTSEL may be set to zero (i.e., to selective route an asynchronous port A request to memory array control circuitry 12). In response to detecting signal DONE falling low, signal Mclk may be clocked high and Arclk may be pulsed high (step 322). At step 324, Aasync may be sampled using latch 118 (e.g., Areq is set to the sampled value of Aasync). At step 326, the desired port A read/write memory access may be performed. In response to detection of a falling Arclk edge, Areq may be sampled using latch 120 (e.g., Areqsyn is set to the sampled valued of Areq), as shown in step 328. If Areq is high, Aasync may be negated (e.g., the oldest port A memory access request presently stored in FIFO 114 may be removed). At step 330, DONE may be pulsed high, thereby triggering Mclk to clock low and Aoutclk to pulse high. Processing may loop back to step 316 to process an additional A port request, if present, as indicated by path 332.

The dual-port implementations of the memory circuitry with arbitration circuit 22 of FIG. 1 and the memory circuitry with semi-synchronous TDM sequencing circuit 101 of FIG. 4 are merely illustrative and do not serve to limit the scope of the present invention. If desired, the asynchronous and semi-synchronous dual-port emulation techniques described herein may be applied to emulate tri-port memory operation, quad-port memory operation, etc.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating a dual-port memory having first and second ports, wherein the dual-port memory includes an array of single-port memory elements, the method comprising:
   receiving a first memory access request and an associated first clock signal at the first port;
   receiving a second memory access request and an associated second clock signal at the second port;
   in response to detecting a rising clock edge in the second clock signal with a control circuit, generating a third clock signal and servicing the second memory access request; and
   while the second memory access request is being serviced, sampling the first memory access request using the third clock signal.

2. The method defined in claim 1 wherein sampling the first memory access request using the third clock signal comprises sampling the first memory access request on the rising and falling clock edges of the third clock signal using at least two series-connected latches.

3. The method defined in claim 1 further comprising:
   storing the first memory access request in a buffer circuit.

4. The method defined in claim 1 further comprising:
   in response to detecting the rising clock edge in the second clock signal with the control circuit, generating a fourth clock signal to control accessing the array of single-port memory elements.

5. The method defined in claim 1 further comprising:
   in response to the second memory access request being fulfilled, receiving a control signal indicative of completion of the second memory access request with the control circuit; and
   in response to receiving the control signal with the control circuit, servicing the first memory access request.

6. The method defined in claim 2 further comprising:
   storing the first memory access request in a buffer circuit, wherein the buffer circuit is operable to receive a control signal from the at least two series-connected latches.

7. The method defined in claim 2 wherein the dual-port memory includes a multiplexing circuit having a first input operable to receive the first memory access request through the at least two series-connected latches, a second input operable to receive the second memory access request, and a control input operable to receive a control signal from the control circuit.

8. The method defined in claim 6 further comprising:
   receiving the third clock signal with the buffer circuit.

9. A method for operating a dual-port memory having first and second ports, wherein the dual-port memory includes an array of single-port memory elements, the method comprising:
   receiving a first memory access request and an associated first clock signal at the first port;
   receiving a second memory access request and an associated second clock signal at the second port;
   in response to the first clock signal going high, temporarily storing the first memory access request in a buffer; and
   in response to detecting a rising clock edge in the second clock signal with a control circuit, servicing the second memory access request while the first memory access request is stored in the buffer.

10. The method defined in claim 9 further comprising:
    in response to detecting the rising clock edge in the second clock signal, triggering a third clock signal with the control circuit.

11. The method defined in claim 9 wherein the buffer comprises a first-in-first-out circuit.

12. The method defined in claim 10 further comprising:
    receiving the third clock signal with a synchronizing circuit, wherein the synchronizing circuit comprises at least two latches; and
    receiving the third clock signal with the buffer.

13. The method defined in claim 12 wherein the at least two latches comprises a positive-edge-triggered latch configured to latch data on a rising clock edge of the third clock signal and a negative-edge-triggered latch configured to latch data on a falling clock edge of the third clock signal.

14. The method defined in claim 12 further comprising:
    receiving a control signal from the synchronizing circuit with the buffer.

15. The method defined in claim 12 further comprising:
    latching the first memory access request using the synchronizing circuit; and
    after the first memory access request has been latched with the synchronizing circuit, removing the first memory access request from the buffer.

16. A dual-port memory having first and second ports comprising:

an array of single-port memory elements;

a first input latch operable to receive a first memory access request and a first clock signal associated with the first port;

a second input latch operable to receive a second memory access request and a second clock signal associated with the second port, wherein the second clock signal is different than the first clock signal;

a control circuit operable to receive the second clock signal and not the first clock signal, wherein the control circuit is further operable to generate a control signal that determines which one of the first and second memory access request is to be selected for fulfillment; and a multiplexing circuit having a first input operable to receive the first memory access request from the first input latch, a second input operable to receive the second memory access request from the second input latch, and a control input operable to receive the control signal from the control circuit.

17. The dual-port memory defined in claim 16 further comprising:

a buffer coupled between the first input latch and the first input of the multiplexing circuit.

18. The dual-port memory defined in claim 17 further comprising:

a positive-edge-triggered latch and a negative-edge-triggered latch coupled between the buffer and the first input of the multiplexing circuit.

19. The dual-port memory defined in claim 17 wherein the buffer comprises a first-in-first-out circuit.

* * * * *